US011133814B1

(12) United States Patent
Patil et al.

(10) Patent No.: US 11,133,814 B1
(45) Date of Patent: Sep. 28, 2021

(54) CONTINUOUS-TIME RESIDUE GENERATION ANALOG-TO-DIGITAL CONVERTER ARRANGEMENTS WITH PROGRAMMABLE ANALOG DELAY

(71) Applicant: Analog Devices International Unlimited Company, Limerick (IE)

(72) Inventors: Sharvil Pradeep Patil, Toronto (CA); Kimo Tam, Lincoln, MA (US); Hajime Shibata, Toronto (CA)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 17/110,902

(22) Filed: Dec. 3, 2020

(51) Int. Cl.
*H03M 1/50* (2006.01)
*H03M 1/12* (2006.01)
(Continued)

(52) U.S. Cl.
CPC ............. *H03M 1/124* (2013.01); *H03M 1/44* (2013.01); *H03M 1/167* (2013.01)

(58) Field of Classification Search
CPC ...... H03M 1/167; H03M 1/124; H03M 1/001; H03M 1/44; H03M 3/344; H03M 1/002; H03M 1/0626; H03M 1/1245; H03M 1/145; H03M 3/416; H03M 3/458; H03M 3/414; H03M 3/464; H03M 1/14; H03M 1/38;
(Continued)

(56) References Cited

U.S. PATENT DOCUMENTS 701,552 A    6/1924  Zobel
792,523 A    3/1927  Zobel
(Continued)

FOREIGN PATENT DOCUMENTS

EP         2779464       9/2014
KR      2012-0054087     5/2012
(Continued)

OTHER PUBLICATIONS

W. Kester, Data Conversion Handbook 3rd edition, Chapter 3, Section 3.2, Analog Devices, Inc. ISBN-10:0750678410, 2004, 142 pages.
(Continued)

*Primary Examiner* — Linh V Nguyen
(74) *Attorney, Agent, or Firm* — Patent Capital Group

(57) ABSTRACT

An example residue generation arrangement for a continuous time or hybrid ADC includes a delay circuit having a cascade of analog delay sections, each section to provide a respective delay to an analog input signal, thus providing a delayed analog input signal at the output of the delay circuit. The delay circuit further includes a selector, configured to select an input or an output of one of the delay sections to provide as an input signal to a quantizer of a feedforward path. The quantizer may generate a digital input to a DAC of the feedforward path based on the output of the selector, and the DAC may generate a feedforward path analog output based on the digital signal generated by the quantizer. The arrangement further includes a summation node, configured to generate a residue signal based on the delayed analog input and the feedforward path analog output.

20 Claims, 6 Drawing Sheets

(51) Int. Cl.
*H03M 1/44* (2006.01)
*H03M 1/16* (2006.01)

(58) Field of Classification Search
CPC ......... H03M 3/43; H03M 3/454; H03M 1/00; H03M 1/005; H03M 1/06; H03M 1/0695
USPC ................................. 341/155, 161, 162, 166
See application file for complete search history.

(56) References Cited

U.S. PATENT DOCUMENTS

| | | | |
|---|---|---|---|
| 5,861,828 | A | 1/1999 | Opris |
| 6,064,507 | A | 5/2000 | Heflinger et al. |
| 6,222,477 | B1 | 4/2001 | Irie et al. |
| 6,489,913 | B1 | 12/2002 | Hansen et al. |
| 6,809,672 | B2 | 10/2004 | Gupta |
| 6,956,517 | B1 | 10/2005 | Baker |
| 7,280,064 | B2 | 10/2007 | Lin |
| 7,443,332 | B2 | 10/2008 | Knudsen et al. |
| 7,561,084 | B1 | 7/2009 | Wong |
| 8,102,206 | B2 | 1/2012 | Shibata |
| 8,284,085 | B2 | 10/2012 | Haroun et al. |
| 8,570,200 | B2 | 10/2013 | Ashburn et al. |
| 8,896,475 | B2 | 11/2014 | Shibata |
| 9,088,292 | B1* | 7/2015 | Pereira ................. G11C 27/026 |
| 9,312,840 | B2 | 4/2016 | Dong et al. |
| 9,432,045 | B2 | 8/2016 | Shibata |
| 10,187,075 | B1* | 1/2019 | Patil .................... H03M 1/0626 |
| 10,432,210 | B1* | 10/2019 | Yendluri ............... H03M 1/466 |
| 10,958,281 | B1* | 3/2021 | Yendluri ............... H03M 1/144 |
| 2005/0057384 | A1 | 3/2005 | Chen et al. |
| 2007/0013571 | A1 | 1/2007 | Fujimoto |
| 2008/0238754 | A1 | 10/2008 | Knudsen |
| 2008/0272944 | A1 | 11/2008 | Zhou |
| 2009/0055678 | A1 | 2/2009 | Kummaraguntl et al. |
| 2009/0096647 | A1* | 4/2009 | Nazemi ................... H03M 1/44 341/122 |
| 2011/0084861 | A1* | 4/2011 | Murden ............... H03M 1/1215 341/118 |
| 2012/0086589 | A1 | 4/2012 | Haroun et al. |
| 2012/0086590 | A1 | 4/2012 | Satarzadeh |
| 2012/0326906 | A1 | 12/2012 | Haroun et al. |
| 2013/0127646 | A1 | 5/2013 | Kumar et al. |
| 2013/0214946 | A1 | 8/2013 | Verbruggen |
| 2014/0266821 | A1 | 9/2014 | Shibata |
| 2015/0042501 | A1 | 2/2015 | Shibata |
| 2015/0109158 | A1 | 4/2015 | Dong |
| 2015/0249445 | A1* | 9/2015 | Dong ..................... H03M 1/14 341/143 |
| 2016/0269045 | A1* | 9/2016 | Srinivasan ............ H03K 5/159 |

FOREIGN PATENT DOCUMENTS

| | | |
|---|---|---|
| WO | 2004/066494 | 8/2004 |
| WO | 2011/029103 | 3/2011 |

OTHER PUBLICATIONS

David Gubbins, Bumha Lee, Pavan Kumar Hanumolu, and Un-Ku Moon, "Continuous-Time Input Pipeline ADCs", IEEE J. Solid State Circuits, vol. 45, No. 8, Aug. 2010, pp. 1456-1468.
Ahmed Gharbiya, and David A. Johns, "A 12-bit 3.125 MHz Bandwidth 0-3 MASH Delta-Sigma Modulator", IEEE J. Solid-State Circuits, vol. 44, No. 7, Jul. 2009, pp. 2010-2018.
Masoud Koochakzadeh et al., "Miniaturized Transmission Lines Based on Hybrid Lattice-Ladder Topology", IEEE Transactions on Microwave Theory and Techniques, vol. 58, No. 4, Apr. 2010, pp. 949-946, 8 pages.
W. Kester, "Oversampling interpolating DACs", MT-017, tutorial documents, Analog Devices, Inc. available at http://www.analog.com/static/imported-files/tutorials/MT-017.pdf, 2009.
B.Y. Karmath et al., "Relationship between frequency response and setting time of operational amplifiers", IEEE Journal of Solid-State Circuits, vol. SC-9, No. 6, Dec. 1974.
David Gubbins, Bumha Lee, Pavan Kumar Hanumolu, and Un-Ku Moon, "A Continuous-Time Input Pipeline ADC", Custom Integrated Circuit Conference, Sep. 2008.
David Gubbins, Bumha Lee, Pavan Kumar Hanumolu, and Un-Ku Moon, "A Continuous-Time Input Pipeline ADC with inherent anti-alias filter", Custom Integrated Circuit Conference, Sep. 2009.
Kwang-Jin Koh et al., *A Millimeter-Wave (40-45 GHz) 16-Element Phased-Array Transmitter in 0.18-µ Si Ge BiCMOS Technology*, IEEE Journal of Solid-State Circuits, vol. 44, No. 5, May 2009, 12 pages.
W.E. Thomson, *Delay Networks Having Maximally Flat Frequency Characteristics*, BNSDOCID: <XP55242803A, Paper No. 872, Radio Section, 621.392.5, (first received Mar. 14, 1949; revised Jul. 14, 1949), 4 pages.
Reddy et al., "A 16-mW 78-dB SNDR 10-MHz BW CT ΔΣ ADC Using Residue-Cancelling VCO-Based Quantizer", IEEE Journal of Solid-State Circuits, vol. 47, No. 12, Dec. 2012, 12 pages.
Shibata et al., "An 800MHz-BW VCO-Based Continuous-Time Pipelined ADC with Inherent Anti-Aliasing and On-Chip Digital Reconstruction Filter", ISSCC 2020 / Session 16 / NYQUIST & VCO-Based ADCs / 16.6, 3 pages.
Li et al., "A 3BSps 12-bit Four-Channel Time-Interleaved Pipelined ADC in 40 nm CMOS Process", MDPI electronics, published Dec. 12, 2019, 16 pages.
Dong et al., "A Continuous-Time 0-3 MASH ADC Achieving 88 dB DR with 53 MHz BW in 28 nm CMOS", IEEE Journal of Solid-State Circuits, vol. 49, No. 12, Dec. 2014, 10 pages.
Dong et al., "A 72 dB-DR 465 MHz-BW Continuous-Time 1-2 MASH ADC in 28 nm CMOS", IEEE Journal of Solid-State Circuits, vol. 51, No. 12, Dec. 2016, 11 pages.
Shibata et al., A 9GS/s 1GHz-BW Oversampled Continuous-Time Pipeline ADC Achieving—161dBFS/Hz NSD, ISSCC 2017, Session 16, Gigahertz Data Converters, 16.2, 3 pages.

\* cited by examiner

CONTINUOUS-TIME RESIDUE GENERATION ANALOG-TO-DIGITAL CONVERTER ARRANGEMENTS WITH PROGRAMMABLE ANALOG DELAY

TECHNICAL FIELD OF THE DISCLOSURE

The present disclosure relates generally to analog-to-digital converters and, more particularly, to analog-to-digital converters that employ continuous-time residue generation.

BACKGROUND

Real-world analog signals such as temperature, pressure, sound, or light are routinely converted to a digital representation that can be easily processed in modern digital signal processing systems. The circuits that perform this conversion of an analog input signal to a digital output signal are referred to as analog-to-digital converters (ADCs). ADCs can translate analog electrical signals representing real-world phenomena such as temperature, pressure, sound, or light to digital signals for data processing purposes.

ADCs can be found in many places such as broadband communication systems, audio systems, receiver systems, etc., and are used in a broad range of applications including communications, energy, healthcare, instrumentation and measurement, motor and power control, industrial automation and aerospace/defense. For example, in precision measurement systems, electronics may be provided with one or more sensors to make measurements, and these sensors may generate an analog signal. The analog signal would then be provided to an ADC as an input to generate a digital output signal for further processing. In another example, an antenna may generate an analog signal based on the electromagnetic waves carrying information/signals in the air. The analog signal generated by the antenna is then provided as an input to an ADC to generate a digital output signal for further processing.

Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
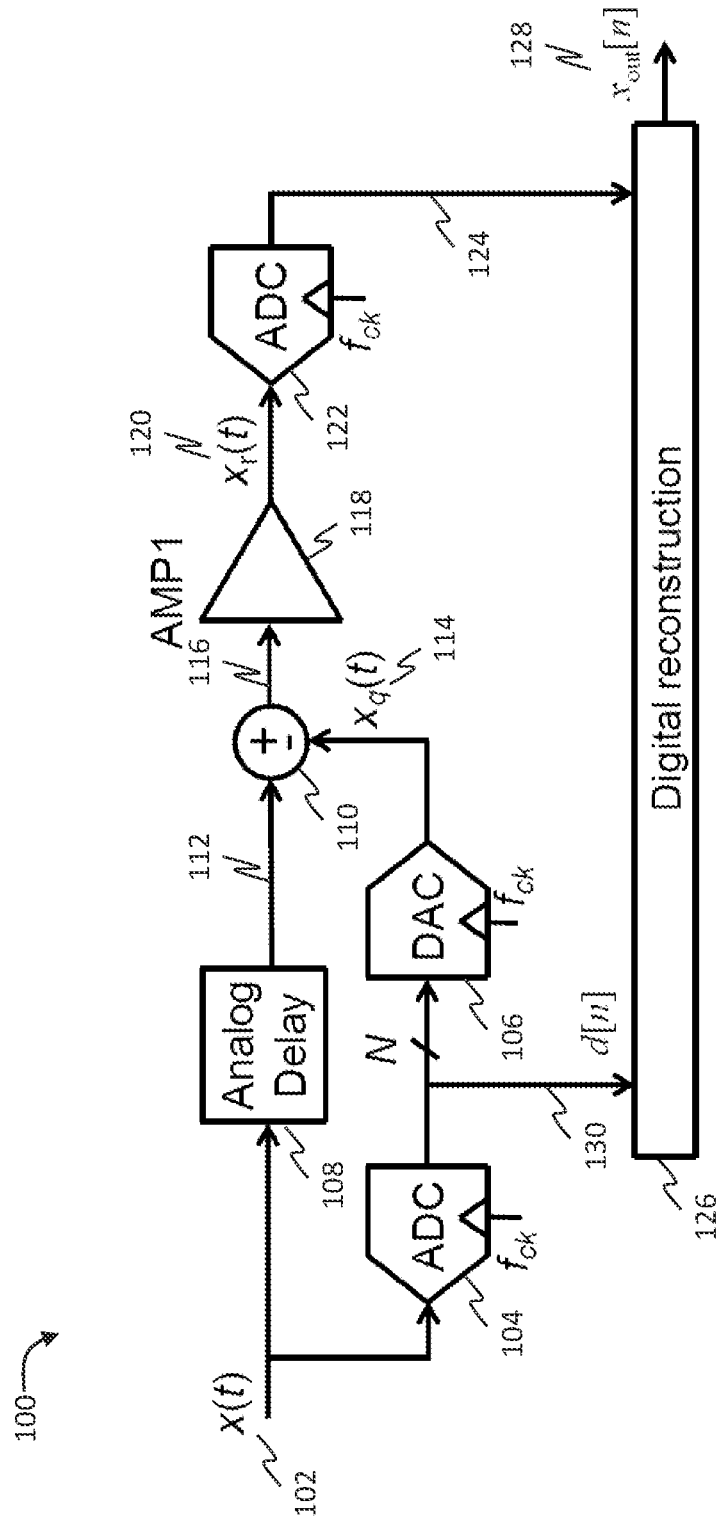
FIG. 1 provides a schematic illustration of an ADC with a continuous-time residue generation arrangement in which programmable analog delay may be implemented, according to some embodiments of the present disclosure.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating continuous-time residue generation ADCs with programmable analog delay, proposed herein, it might be useful to first understand phenomena that may come into play in ADCs. The following foundational information may be viewed as a basis from which the present disclosure may be properly explained. Such information is offered for purposes of explanation only and, accordingly, should not be construed in any way to limit the broad scope of the present disclosure and its potential applications.

ADCs are electronic devices that convert a continuous physical quantity carried by an analog signal to a digital number that represents the quantity's amplitude (or to a digital signal carrying that digital number). The conversion involves quantization of the analog input signal, i.e. a process of mapping input values from a continuous set of analog values to output values in a countable smaller set of digital values, so it would introduce a small amount of error. Typically, the quantization occurs through periodic sampling of the analog input signal. The result is a sequence of digital values (i.e., a digital signal) that represents conversion of a continuous-time and continuous-amplitude analog input signal to a discrete-time (DT) and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal to noise ratio (SNR), signal-to-noise-and-distortion ratio (SINAD), effective number of bits (ENOB), total harmonic distortion (THD), total harmonic distortion plus noise (THD+N), and spurious free dynamic range (SFDR). ADCs have many different designs, which can be chosen based on the application requirements and performance specifications.

ADCs based on continuous-time (CT) residue generation arrangements (e.g., CT pipelined (CTP) residue generation arrangements) are increasingly popular in high-performance and high-speed data converters, partly due to their inherent anti-aliasing and their potential to achieve high sampling rates, driven by their feedforward architecture. In a CT pipeline stage of an ADC, a CT analog input signal is sent to two different paths. A first path, typically referred to as a "feedforward" path, includes a cascade of a quantizer and a feedforward digital-to-analog converter (DAC). A second path, typically referred to as a "forward" path, includes an analog delay to align the delays of the input signal in the feedforward and forward paths. A subtractor may then subtract the output of the analog delay of the forward path from the output of the DAC in the feedforward path to generate a residue signal. This residue signal may then be processed, e.g., filtered and amplified by an amplifier, and the processed residue signal may be provided to subsequent stages of the ADC.

As the foregoing illustrates, the feedforward architecture requires a tight alignment of the transfer functions undergone by the input signal in the two paths of a pipeline stage. Since in a CTP ADC, the signal is not upfront-sampled in DT, an analog delay line is used to align the delays of the input signal in the two paths in CT. To avoid the power dissipation overhead of an active delay line, passive reciprocal lattice delay structures have been used in the past to implement the analog delay of the forward path. Among these, LC lattice delays provide the best group delay performance and constant input-output impedances over wide bandwidths. Unfortunately, such implementations of the forward path analog delay require inductors, which are bulky and offer little programmability. Therefore, LC lattice delay structures are not suitable for applications that require a good degree of programmability.

RC lattice delay structures have been developed as an alternative to the LC lattice delay structures, by replacing inductors with resistors, thereby allowing delay programmability with a much smaller footprint. However, such delay structures come with an own set of challenges. One challenge is that RC lattice delay structures do not provide a constant group delay and input-output impedances over wide bandwidths. When used as the analog delay line in a CTP ADC, they often worsen the delay matching in the two paths of the pipeline near the band-edge, thereby increasing the leakage of the band-edge signal component into the residue signal passed to the backend ADC. Said leakage, in turn, demands lowering of the inter-stage gain to avoid backend overload, which compromises the noise spectral density (NSD) of the ADC. Furthermore, the use of resistors in place of inductors increases the delay line noise and thus further worsens the NSD.

Embodiments of the present disclosure provide residue generation arrangements with delay circuits that aim to provide analog delay for a stage of an ADC in a manner that improves on at least some of the challenges described above. Mechanisms described herein may be applicable to CT as well as hybrid (i.e., part CT, part DT) ADCs and may be implemented in ADCs of various types of architectures, such as pipelined ADCs, multi-stage noise shaping (MASH) ADCs, voltage controller oscillator (VCO) ADCs, and other ADCs utilizing generation and processing of residue signals. Some of the mechanisms described herein may be especially attractive for high-performance and high-speed converter applications. One aspect of the present disclosure provides a residue generation arrangement for use in a CT stage of an ADC, the arrangement including a delay circuit that includes a cascade of a plurality of analog delay sections (i.e., several delay sections connected in series), coupled between an input and an output of the delay circuit, where each delay section is configured to provide a respective delay to an analog input signal, thus providing a delayed analog input signal at the output of the delay circuit. The delay circuit further includes a selector (e.g., a multiplexer), configured to select either an input or an output of one of the delay sections to provide as an input signal to a quantizer of a feedforward path. The quantizer may generate a digital input to a DAC of the feedforward path based on the output of the selector (which is based on either the input or the output of the selected one of the delay sections), and the DAC may generate a feedforward path analog output based on the digital signal generated by the quantizer. The arrangement may further include a summation node, configured to generate a residue signal based on the delayed analog input and the feedforward path analog output. Using a cascade of multiple delay sections where the inputs or the outputs of the different delay sections are tapped and selectively fed using a selector to the quantizer of the feedforward path of a pipeline stage advantageously provides flexibility to selectively tap different sectional inputs/outputs of the delay circuit, thus allowing programmability of the net analog delay of the signal in the forward path with respect to that of the feedforward path with a time resolution substantially equal to the delay of an individual delay section. Additionally, at least some of the residue generation arrangements described herein may be implemented with one or more of good group delay performance, relatively small design, and relatively small power dissipation overheads.

As will be appreciated by one skilled in the art, at least some aspects of the present disclosure, in particular at least some aspects of residue generation with programmable analog delay as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." At least some functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing ADCs and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" or the term "signal" may be omitted (e.g., an analog input signal 102 shown in the present drawings may be referred to in the present descriptions as an "analog input 102" etc.). If used, the terms "substantially," "approximately," "about," etc., may be used to generally refer to being within +/−20% of a target value, e.g., within +/−10% of a target value, based on the context of a particular value as described herein or as known in the art.

Other features and advantages of the disclosure will be apparent from the following description and the claims.

A CT Stage of an ADC with an Analog Delay in Forward Path

FIG. 1 provides a schematic illustration of an ADC 100 with a CT residue generation arrangement in which programmable analog delay may be implemented, according to some embodiments of the present disclosure. As shown in FIG. 1, a CT analog input, x(t), 102 is sent to two different paths: a feedforward path and a forward path. The feedforward path includes a cascade of a quantizer 104 and a feedforward DAC 106. The forward path includes a circuit configured to apply an analog delay to the input signal 102. Thus, the CT analog input x(t) 102 is applied to the delay circuit 108 in the forward path and to a cascade of the N-bit ADC implementing the quantizer 104 and an N-bit DAC implementing the feedforward DAC 106, which may be clocked at a sampling rate of $f_{ck}$ in the feedforward path. A summation node (e.g., a subtractor) 110 may then generate a residue signal, $x_r(t)$, 116 based on a delayed input signal 112 (which is the output of the forward path) and an output, $x_q(t)$, 114 of the DAC 106 (which is the output of the feedforward path). For example, in some embodiments, the summation node 110 may generate the residue signal 116 by subtracting the feedforward path output 114 from the forward path output 112, or the other way around. The residue signal 116 may then be processed, e.g., filtered and amplified by an amplifier, $AMP_1$, 118, and the processed residue signal 120 may be provided to subsequent pipeline stages in an ADC (not shown in FIG. 1). Eventually, a signal based on the processed residue signal 120 may be provided to a backend ADC 122, to be digitized by the backend ADC 122 to generate a digital residue signal 124. The ADC 100 may further include a digital reconstruction block 126, configured to generate an ADC output $x_{out}[n]$, 128 based on the digital residue signal 124, a digital signal d[n] 130 output by the quantizer 104, and any digital signal generated by the quantizers in the intermediate pipeline stages in the ADC (not shown in FIG. 1).

The quantizer 104, the DAC 106, the delay circuit 108, the summation node 110, and the amplifier 118 may be considered to be a first stage, or a residue generation arrangement, of the ADC 100. In some embodiments, the ADC 100 may include multiple such stages, coupled in series, i.e., the input signal 102 for the subsequent stage is the amplified residue signal 120 of the preceding stage. In some embodiments, the first stage of the ADC 100 may be coupled to a second stage, configured to process a signal based on the residue signal output by the first stage, where the second stage may either be a CT stage or a DT stage.

Embodiments of the present disclosure propose systems and methods for providing programmable analog delay in generating residue signals of a CT residue generation stage of an ADC based on the use of a plurality of cascaded delay sections and a selector configured to selectively tap an input or an output of one of the delay sections to use as an input to the feedforward path.

Figure 2:
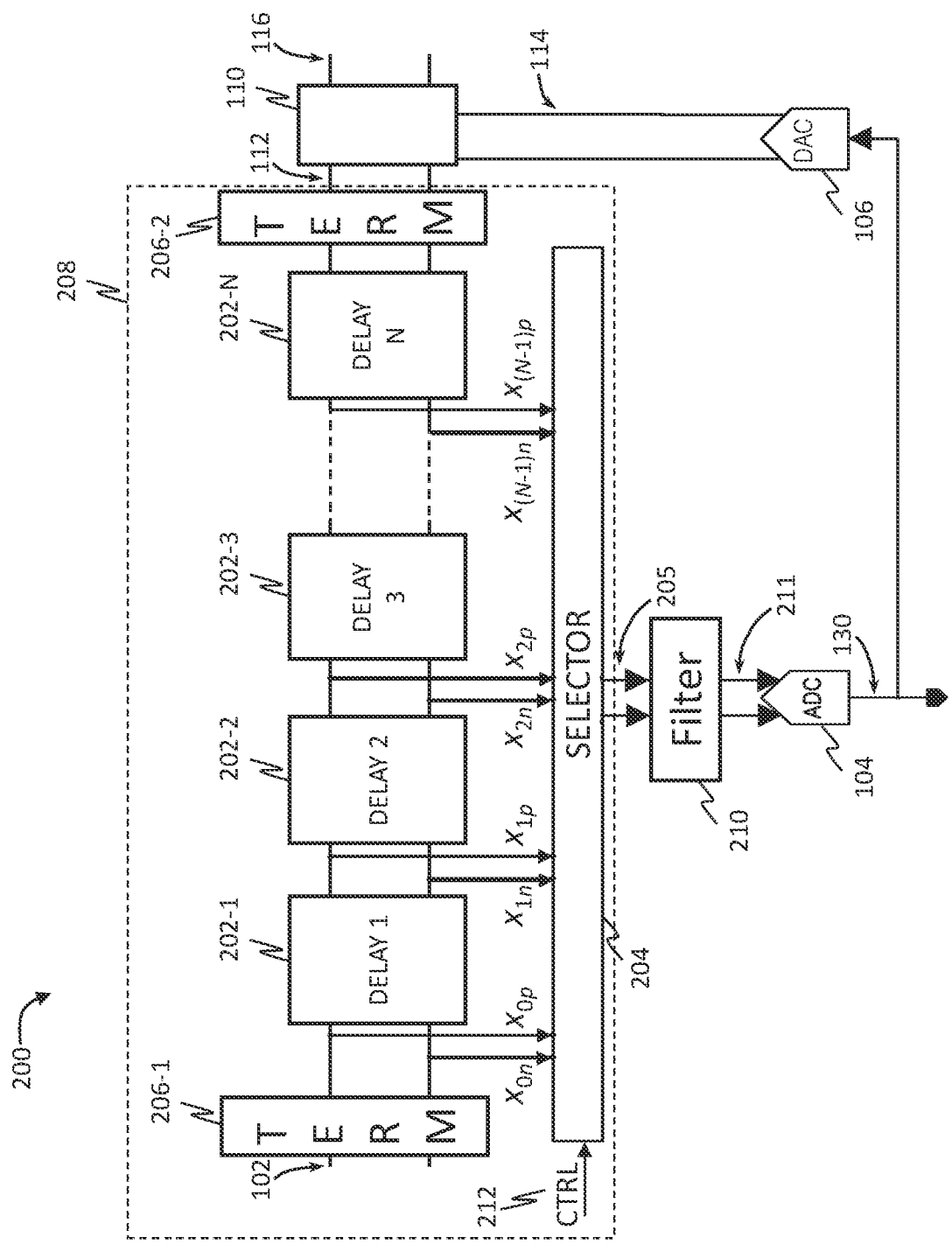
FIG. 2 provides a schematic illustration of a residue generation arrangement with programmable analog delay, according to some embodiments of the present disclosure.

FIG. 2 provides a schematic illustration of a residue generation arrangement 200 with programmable analog delay, according to some embodiments of the present disclosure. The residue generation arrangement 200 may be included in the ADC 100 and, therefore, some of the elements shown in FIG. 2 are labeled with reference numerals shown in FIG. 1 to indicate similar or analogous elements, so that description of these elements provided with respect to one of these drawings is applicable to the other (the same holds for other drawings of the present disclosure). The residue generation arrangement 200 may be used as a residue generator in a CT stage of any of suitable multi-stage ADCs, such as CT as well as hybrid ADCs, implemented in various types of architectures, such as e.g. pipelined ADCs, MASH ADCs, VCO ADCs, and other ADCs utilizing residue signals.

As shown in FIG. 2, in some embodiments, the residue generation arrangement 200 may include a delay circuit 208 that includes a cascade of N analog delay sections 202 (where N is any integer greater than 1) and a selector 204. Individual delay sections 202 are shown in FIG. 1 as delay sections 202-1 through 202-N. The N delay sections 202 are cascaded, meaning that an input of the first delay section 202-2 is the input to the delay circuit 208, e.g., provided from an input termination circuit 206-1, and that each subsequent delay section 202-$i$ is configured to receive an output of the immediately preceding delay section 202-($i$−1) as an input for the delay section 202-$i$. Each delay section 202 is configured to provide/apply a respective delay to the input signal provided at the input of the delay circuit 208, to produce a delayed input signal at the output of the delay circuit 208, e.g., at the output of an output termination circuit 206-2. As is known in the art, input and output termination circuits 206-1 and 206-2 may be used to provide impedance matching and prevent impairments such as signal reflections, distortion etc. FIG. 2 illustrates that an input signal provided to the input of the delay circuit 208 may be the input signal 102, described above, while the output signal provided at the output of the delay circuit 208 may be the delayed input signal 112 (i.e., a delayed version of the input signal 102), also described above. In some embodiments, different delay sections 202 may be configured to provide different delays to the input signals received by the sections. In other embodiments, at least some of the delay sections 202 may be configured to provide the same amount of delay, e.g., all of the delay sections 202 may be configured to add the same amount of delay to the input signal 102.

The selector 204 may be configured to either receive the inputs to each of the delay sections 202 (as shown in the embodiment illustrated in FIG. 2) or receive the outputs of each of the delay sections 202 (not specifically shown in the present drawings), and select either the received input or the received output of one of the delay sections 202 to provide as an output of the selector 204. In the following, embodiments of the present disclosure are described (and shown) with reference to the selector 204 receiving the inputs to the individual delay sections 202 as inputs to the selector 204 and providing one of these inputs as an output of the selector 204. For example, FIG. 2 illustrates that the selector 204 may receive the following inputs: a differential analog input, $x_{0n}$ and $x_{0p}$, to the delay section 202-1 (which may be, or may be based on, the input signal 102 to the delay circuit 208), a differential analog input, $x_{1n}$ and $x_{1p}$, to the delay section 202-2 (which may be, or may be based on, the analog output from the delay section 202-1), a differential analog input, $x_{2n}$ and $x_{2p}$, to the delay section 202-3 (which may be, or may be based on, the analog output from the delay section 202-2), and so on, until a differential analog input, $x_{(N-1)n}$ and $x_{(N-1)p}$, to the delay section 202-N (which may be, or may be based on, the analog output from the delay section 202-(N−1)). The selector 204 may then select one of its inputs as a signal provided at its output, e.g., as a selector output signal 205. However, these descriptions and illustrations are equally applicable, with minor modifications that would be apparent based on the present disclosure, to embodiments where the selector 204 is configured to receive the outputs to the individual delay sections 202 as inputs to the selector 204 and providing one of these outputs as the output of the selector 204.

In some embodiments, the selector 204 may include a multiplexer. In some embodiments, the selection of which of the multiple inputs to the selector 204 will form basis of a signal provided as the selector output signal 205 may be based on a control signal 212 received by the selector 204, indicating which input to the select. An input to the quantizer 104 may be based on the selector output signal 205. For example, as shown in FIG. 2, in some embodiments, the residue generation arrangement 200 may include a filter 210, configured to receive the selector output signal 205 and filter it to generate a filtered selector output signal 211, which may then be provided to the quantizer 104. For example, the filter 210 may be an anti-aliasing filter. For example, the filter 210 may be configured to reduce or eliminate blockers, where, as used in the art, the term "blocker" refers to any signal that is present outside the bandwidth where desired signals lie. With or without the filter 210 included in the residue generation arrangement 200, an input to the quantizer 104 is based on the selector output signal 205, which, together with the segmented nature of the cascade of the delay sections 202, enables the programmability of the analog delay between signals propagating in the forward and the feedforward paths of the residue generation arrangement 200. For example, if the selector 204 selects the input to the first delay section 202-1 to be provided as the selector output signal 205, then, in the forward path, the input signal 102 undergoes delay of all of the delay sections 202-1 through 202-N, while, in the feedforward path, the quantizer 104 receives as an input the input signal 102 that has not undergone delay of any of the delay sections 202. Thus, effectively, the analog delay provided by the delay circuit 208 in this example is a sum of all of the delays of the delay sections 202-1 through 202-N. Considering another example, if the selector 204 selects the input to the third delay section 202-3 to be provided as the selector output signal 205, then, in the forward path, the input signal 102 still undergoes delay of all of the delay sections 202-1 through 202-N (as in the first example), while, in the feedforward path, the quantizer 104 receives as an input the input signal 102 that has undergone the delay of the delay sections 202-1 and 202-2 but has not undergone delay of the remaining delay sections 202. Thus, effectively, the analog delay provided by the delay circuit 208 is only a sum of the delays of the delay sections 202-3 through 202-N (because the delays added by the delay sections 202-1 and 202-2 are applied to both forward and feedforward paths and, therefore, result in a net delay of zero between these two paths). In some implementations, the selector 204 may be seen as operating in different modes, where in one mode the selector 204 is configured to select the input or the output of one of the delay sections 202, in another mode the selector 204 is configured to select the input or the output of another one of the delay sections 202, and so on. In some embodiments, programmability of the total analog delay provided by the delay circuit 208 may be further enhanced by configuring the delay to be added to different sections 202 to be programmable, e.g., by changing the values of the components included in the individual delay sections 202.

Since the cascade of the N delay sections 202 receives the input signal 102 as an input and provides the delayed input signal 112 as the output, the N delay sections 202 may be seen as a part of the delay circuit 108 of the ADC 100 FIG. 1. In order to implement programmable analog delay in the ADC 100 of FIG. 1, the selector 204 is added so that an input to the quantizer 104 of the ADC 100 may be a signal based on the output 205 of the selector 204, instead of the input signal 102 itself. The quantizer 104 may then generate the signal 130, as described above, based on the selector output signal 205, and the signal 130 is provided as a digital input to the feedforward DAC 106, as shown in FIG. 2, for the DAC 106 to convert the digital input 130 to an analog signal, which is the feedforward path analog output 114. The summation node 110, also shown in FIG. 2, may then generate the residue signal 116 based on the delayed input signal 112 provided at the output of the cascade of N delay sections 202 (i.e., the forward path analog output) and based on the feedforward path analog output 114, as described above.

While FIG. 2 illustrates differential implementation of the components of the delay circuit 208, the filter 210, the amplifier 110, the input to the quantizer 104 and the output of the feedforward DAC 106, in other embodiments of the residue generation arrangement 200 one or more of inputs or outputs to any of these components, or portions thereof, may be single-ended.

In various embodiments, any delay circuits may be used to implement individual ones of the delay sections 202. Two non-limiting examples as shown in FIGS. 3A and 3B.

Figure 3B:
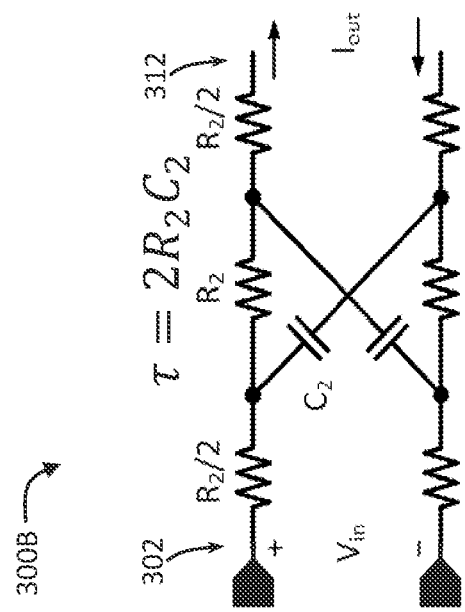
FIG. 3B illustrates an example RC lattice delay section that may be used as one of a plurality of delay sections of a residue generation arrangement with programmable analog delay, according to some embodiments of the present disclosure.
Figure 3A:
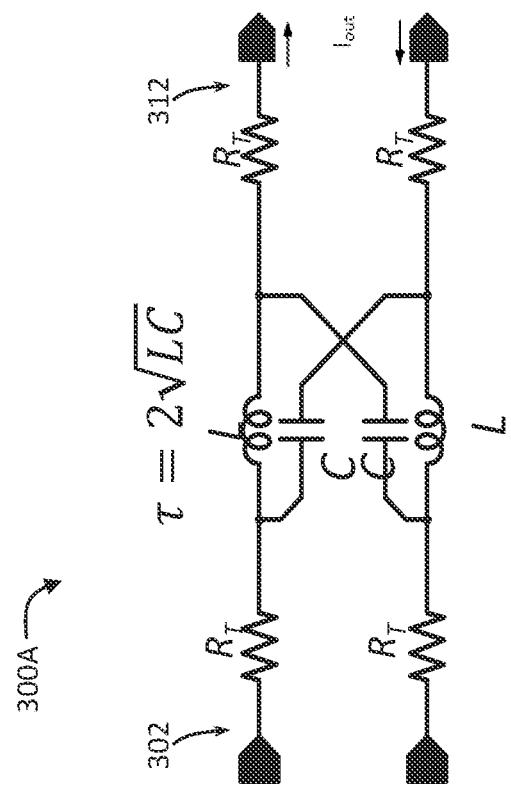
FIG. 3A illustrates an example LC lattice delay section that may be used as one of a plurality of delay sections of a residue generation arrangement with programmable analog delay, according to some embodiments of the present disclosure.

FIG. 3A illustrates an example LC lattice delay section 300A that may be used as one of a plurality of the delay sections 200 of the residue generation arrangement of FIG. 2, according to some embodiments of the present disclosure.

As shown in FIG. 3A, the delay section 300A may include an LC lattice structure configured to receive a differential analog input signal 302 and generate a delayed differential analog output signal 312 (i.e., a delay version of the input signal 302), where the LC lattice structure includes two inductive components (shown as inductors L) and two capacitive components (shown as capacitors C). In the delay section 300A, either the two inductive components are cross-coupled or the two capacitive components are cross-coupled. FIG. 3A illustrated the embodiment where the capacitive components are cross-coupled. Consider that the top signal line shown in FIG. 3A is a positive branch and the bottom signal line shown in FIG. 3A is a negative branch of differential signaling illustrated in this drawing, and that the top capacitive component shown in FIG. 3A is a first capacitive component and the bottom capacitive component shown in FIG. 3A is a second capacitive component. In this case, the cross-coupling of the first capacitive component is shown in FIG. 3A with one terminal of the first capacitive component being coupled to an input terminal of the inductive component in the positive branch of the differential input signal 302 and the other terminal of the first capacitive component being coupled to an output terminal of the inductive component in the negative branch of the differential input signal 302. Similarly, the cross-coupling of the second capacitive component is shown in FIG. 3A with one terminal of the second capacitive component being coupled to an input terminal of the inductive component in the negative branch of the differential input signal 302 and the other terminal of the second capacitive component being coupled to an output terminal of the inductive component in the positive branch of the differential input signal 302. An embodiment of the delay section 300A where the inductive components are cross-coupled may be realized by swapping inductive and capacitive components shown in FIG. 3A, these embodiments being within the scope of the present disclosure. In some embodiments, the delay section 300A may further include a resistor $R_T$ in each of the positive and negative branches of the differential input signal 302 (the resistor $R_T$ in each of the positive and negative branches of the differential input signal 302 being an example of an input termination circuit for the delay section 300A, similar to the input termination circuit 206-1, shown in FIG. 2 but for the entire cascade of the delay sections 202), and/or a resistor $R_T$ in each of the positive and negative branches of the delayed differential output signal 312 (the resistor $R_T$ in each of the positive and negative branches of the differential output signal 312 being an example of an output termination circuit for the delay section 300A, similar to the output termination circuit 206-2, shown in FIG. 2 but for the entire cascade of the delay sections 202). In some embodiments, a delay $\tau$ introduced by the delay section 300A may be proportional to a square root of a product of the inductance of the inductive component and a capacitance of the capacitive component, e.g., the delay may be estimated as $\tau=2\sqrt{LC}$. In general, any one of the delay sections 202 may be implemented as the LC lattice delay section 300A, each associated with a respective resonant frequency. In some embodiments where multiple delay sections 202 are implemented as the LC lattice delay sections 300A, at least two of the delay sections 202 may have different resonant frequencies to provide a wide-band delay over frequency of the arrangement 200.

FIG. 3B illustrates an example RC lattice delay section 300B that may be used as one of a plurality of the delay sections 200 of the residue generation arrangement of FIG. 2, according to some embodiments of the present disclosure. As shown in FIG. 3B, the delay section 300B may include an RC lattice structure configured to receive a differential analog input signal 302 and generate a delayed differential analog output signal 312 (i.e., a delay version of the input signal 302), where the RC lattice structure includes two resistive components (shown as resistors $R_2$) and two capacitive components (shown as capacitors $C_2$). In the delay section 300B, either the two resistive components are cross-coupled or the two capacitive components are cross-coupled. FIG. 3B illustrated the embodiment where the capacitive components are cross-coupled. Consider that the top signal line shown in FIG. 3B is a positive branch and the bottom signal line shown in FIG. 3B is a negative branch of differential signaling illustrated in this drawing, and that the top capacitive component shown in FIG. 3B is a first capacitive component and the bottom capacitive component shown in FIG. 3B is a second capacitive component. In this case, the cross-coupling of the first capacitive component (e.g., the top capacitive component shown in FIG. 3B) is shown in FIG. 3B with one terminal of the first capacitive component being coupled to an input terminal of the resistive component in the positive branch of the differential input signal 302 and the other terminal of the first capacitive component being coupled to an output terminal of the resistive component in the negative branch of the differential input signal 302. Similarly, the cross-coupling of the second capacitive component is shown in FIG. 3B with one terminal of the second capacitive component being coupled to an input terminal of the resistive component in the negative branch of the differential input signal 302 and the other terminal of the second capacitive component being coupled to an output terminal of the resistive component in the positive branch of the differential input signal 302. An embodiment of the delay section 300B where the resistive components are cross-coupled may be realized by swapping resistive and capacitive components shown in FIG. 3B, these embodiments being within the scope of the present disclosure. In some embodiments, the delay section 300B may further include a resistor $R_2/2$ in each of the positive and negative branches of the differential input signal 302 (the resistor $R_2/2$ in each of the positive and negative branches of the differential input signal 302 being an example of an input termination circuit for the delay section 300B, similar to the input termination circuit 206-1, shown in FIG. 2 but for the entire cascade of the delay sections 202), and/or a resistor $R_2/2$ in each of the positive and negative branches of the delayed differential output signal 312 (the resistor $R_2/2$ in each of the positive and negative branches of the differential output signal 302 being an example of an output termination circuit for the delay section 300B, similar to the input termination circuit 206-2, shown in FIG. 2 but for the entire cascade of the delay sections 202). In some embodiments, a delay r introduced by the delay section 300B may be proportional to a product of the resistance of the resistive component and a capacitance of the capacitive component, e.g., the delay may be estimated as $\tau=2R_2C_2$. In general, any one of the delay sections 202 may be implemented as the RC lattice delay section 300B, each associated with a respective resonant frequency. In some embodiments where multiple delay sections 202 are implemented as the RC lattice delay sections 300B, at least two of the delay sections 202 may have different resonant frequencies to provide a wide-band delay over frequency of the arrangement 200.

Figure 4:
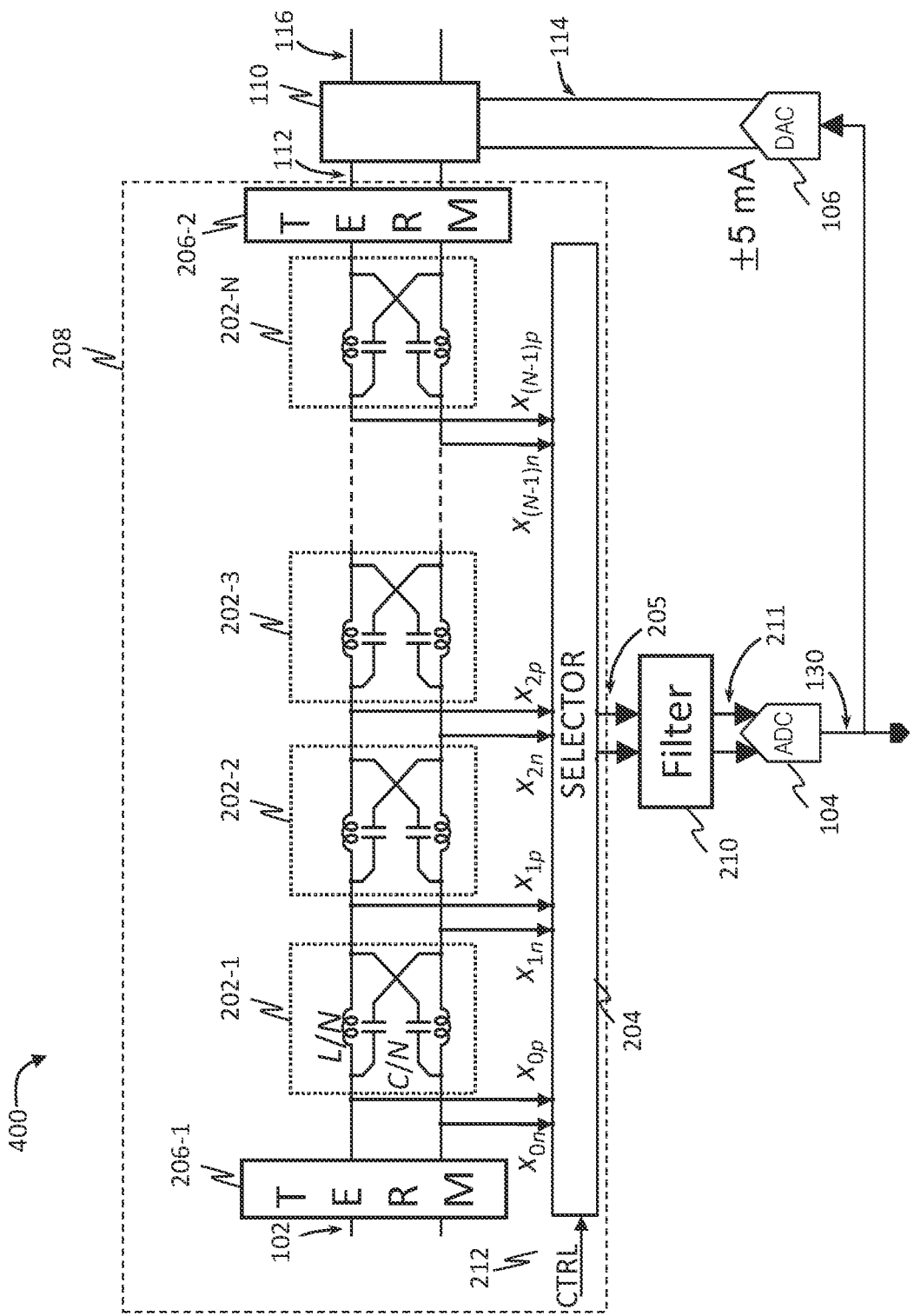
FIG. 4 provides a schematic illustration of a residue generation arrangement with programmable analog delay implemented using a plurality of LC lattice delay sections, according to some embodiments of the present disclosure.

FIG. 4 provides a schematic illustration of a residue generation arrangement 400 with programmable analog delay implemented using a plurality of LC lattice delay sections, according to some embodiments of the present disclosure. The residue generation arrangement 400 is substantially the same as the residue generation arrangement 200 shown in FIG. 2, except that each of the delay sections 202 is shown to be an LC lattice delay section similar to the delay section 300A except that the value of each of the inductive components in the delay sections 202 of the residue generation arrangement 400 is L/N (as opposed to the value being L in the delay section 300A, shown in FIG. 3A) and the value of each of the capacitive components in the delay sections 202 of the residue generation arrangement 400 is C/N (as opposed to the value being C in the delay section 300A, shown in FIG. 3A). This scaling by the integer N may be performed in order to realize a total delay of $\tau=2\sqrt{LC}$ from the N delay sections 202. Other descriptions provided with respect to the residue generation arrangement 200 are applicable to the residue generation arrangement 400 and, therefore, in the interests of brevity, are not repeated.

Exemplary Method for Generating a Residue Signal

Figure 5:
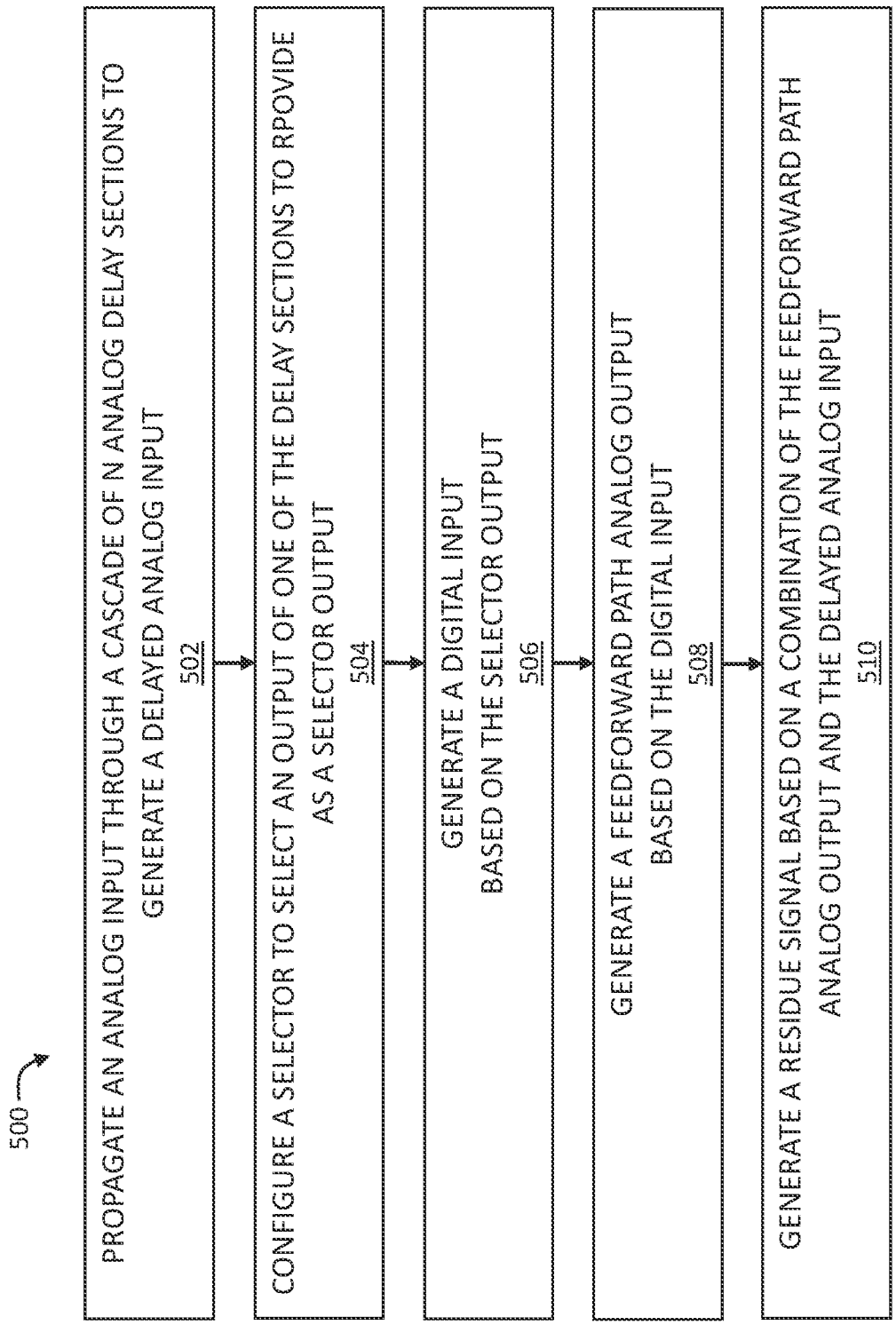
FIG. 5 is a flow diagram illustrating a method for generating a residue signal using a residue generation arrangement with programmable analog delay, according to some embodiments of the present disclosure.

FIG. 5 is a flow diagram illustrating a method 500 for generating a residue signal using a residue generation arrangement with programmable analog delay, according to some embodiments of the present disclosure. The method may be used for any residue-generating ADC implementing at least one CT residue generation stage implementing a cascade of N delay sections (e.g., the delay sections 202) and a selector (e.g., the selector 202), as described herein. The method outlined is described for a particular residue generation element/system. It is envisioned by the disclosure that the same method can be applied to other residue generation arrangements that may be present within the ADC, e.g., to residue generation arrangements in other stages of conversion.

As shown in FIG. 5, the method 500 may begin with a process 502, which includes propagating an analog input signal through a plurality of cascaded analog delay sections (e.g., through the N delay sections 202). The first delay section 202-1 would be configured to receive an analog input (e.g., the analog input signal 102) as an input and apply a first delay to the analog input to generate an output. After that, each subsequent delay section 202-2 through 202-N would be configured to receive the output of a preceding delay section as a input and to apply a respective delay to the output of the preceding delay section to generate an output. The output of the last delay section 202-N may then serve as the output of the forward path, e.g., the delayed analog input signal 112.

The method 500 may also include a process 504, which includes configuring a selector (e.g., the selector 204) to select the input or the output of one of the plurality of cascaded analog delay sections to provide as an output of the selector (e.g., as the selector output signal 205). The output of the selector may then serve as an input to the feedforward path, e.g., as an input to the quantizer 106.

The method 500 may also include a process 506, which includes a quantizer (e.g., the quantizer 104) generating a digital output based on the input that is the output of the selector generated in the process 504. Since the output of the quantizer 104 is provided as an input to a feedforward DAC (e.g., the DAC 106), the digital signal at the output of the quantizer may be referred to as a "digital input" for the DAC.

The method 500 may then include a process 508, which includes a feedforward DAC (e.g., the DAC 106) generating a feedforward path analog output based on the digital input generated in the process 506. The output of the DAC 106 may then serve as the output of the feedforward path, e.g., the feedforward path analog output signal 114.

The method 500 may further include a process 510, which includes a summation node (e.g., the summation node 110) generating a residue signal based on a combination of the feedforward path analog output generated in the process 508 and the output of a last delay section of the plurality of cascaded analog delay sections (i.e., the forward path analog output) generated in the process 502. The residue signal generated in the process 510 may be either the residue signal 116 as described herein or the amplified version of such a residue signal, i.e. the amplified residue signal 120 generated by the amplifier 118.

Exemplary Residue Generation Apparatus

In some embodiments, a residue generation apparatus may include a first stage comprising at least a residue generation arrangement as described herein, configured to generate a residue signal, and a second stage configured to process the residue signal received from the first stage. The residue signal of the first stage may be injected into the second stage for further processing there. For example, the residue signal may be digitized by the second stage.

The residue generation arrangement of the first stage may include means for digitizing an analog input to generate a digital output. Examples of such means include quantizers described herein, with an analog input provided to the quantizers being either an input or an output of one of the N delay sections of a delay circuit, tapped by a selector, as described herein. The first stage may further include means for amplifying and/or filtering the residue signal before it is provided to the second stage. Examples of such means include inter-stage amplifiers described herein, e.g. the amplifier 118.

The apparatus can be a CT or a hybrid ADC, implementing at least one residue generation arrangement implemented as described with reference to any one of FIGS. 1-6.

Example RF Device

Figure 6:
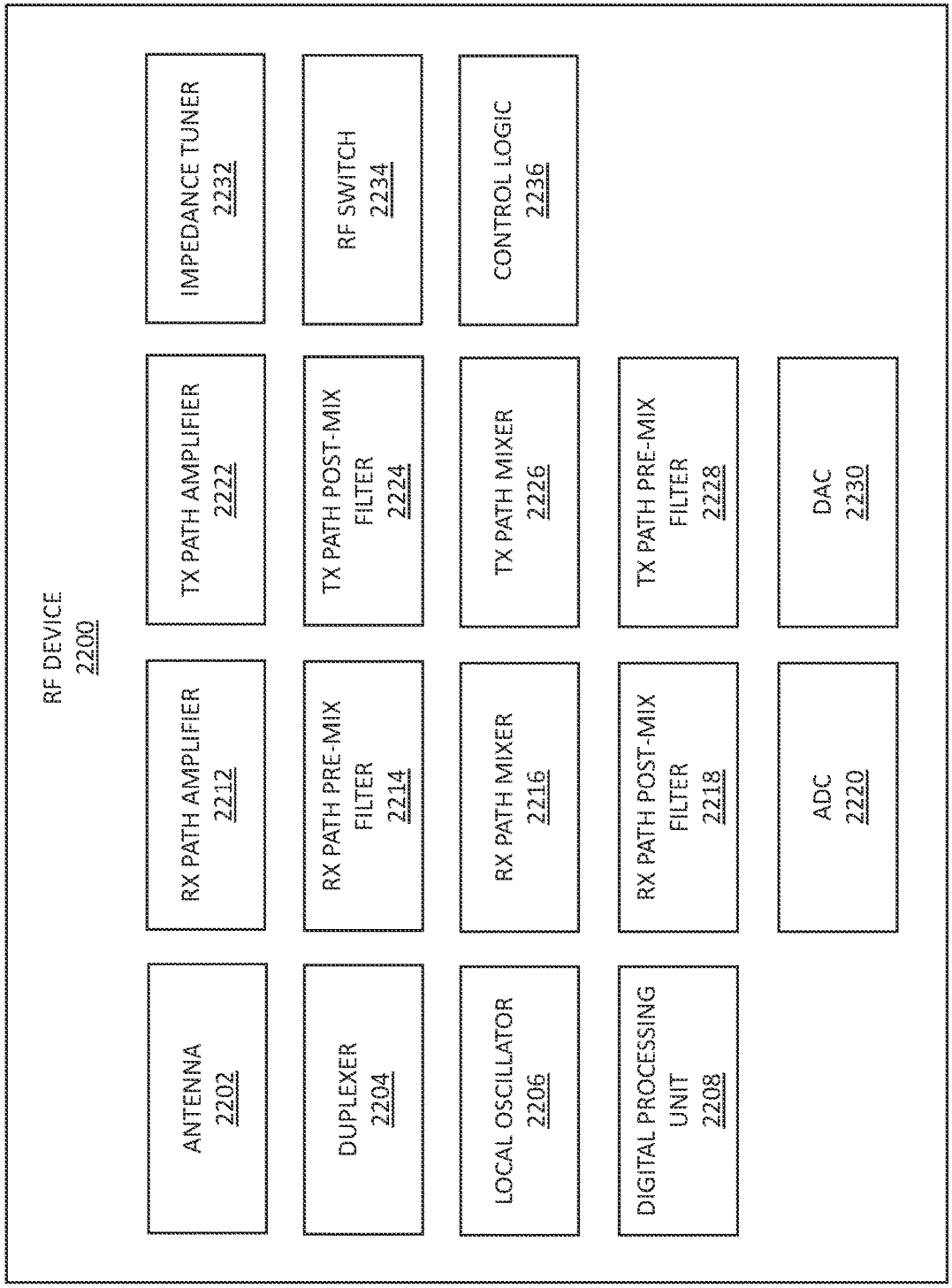
FIG. 6 provides a schematic block diagram illustrating a radio frequency (RF) device in which a residue generation arrangement with programmable analog delay may be implemented, according to some embodiments of the present disclosure.

RF devices are devices that transmit and receive signals in the form of electromagnetic waves in the RF range of approximately 3 kilohertz (kHz) to 300 gigahertz (GHz). RF devices are commonly used for a large variety of applications such as wired and wireless communications, automotive radar, industrial radar, medical applications, or military applications, with cellular/wireless mobile technology (i.e., wireless communications) being a prominent example. In some embodiments, while not limited to, ADCs with residue generation arrangements with programmable analog delay as disclosed herein may be included in various RF devices and systems used in wireless communications. For example, ADCs with residue generation arrangements with programmable analog delay as disclosed herein may be particularly beneficial for use in fifth generation (5G) wireless communications, e.g., in millimeter-wave (mm-wave) or sub-6 GHz, applications. For illustration purposes only, one example RF device that may include any of the residue generation arrangements with programmable analog delay as disclosed herein is shown in FIG. 6 and described below. However, in general, residue generation arrangements with programmable analog delay as disclosed herein may be included in other RF devices and systems, all of which being within the scope of the present disclosure.

FIG. 6 provides a schematic block diagram illustrating an RF device in which a residue generation arrangement with programmable analog delay may be implemented, according to some embodiments of the present disclosure.

In general, the RF device 2200 may be any device or system that may support wireless transmission and/or reception of signals in the form of electromagnetic waves in the RF range of approximately 3 kHz to approximately 300

GHz. In some embodiments, the RF device 2200 may be used for wireless communications, e.g., in a base station (BS) or a user equipment (UE) device of any suitable cellular wireless communications technology, such as GSM, WCDMA, or LTE. In a further example, the RF device 2200 may be used as, or in, e.g., a BS or a UE device of a mm-wave wireless technology such as 5G wireless (i.e., high-frequency/short-wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as MRI.

In various embodiments, the RF device 2200 may be included in frequency-domain duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 6 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single system on chip (SOC) die.

Additionally, in various embodiments, the RF device 2200 may not include one or more of the components illustrated in FIG. 6, but the RF device 2200 may include interface circuitry for coupling to the one or more components. For example, the RF device 2200 may not include a digital processing unit 2208 but may include interface circuitry (e.g., connectors and supporting circuitry) to which the digital processing unit 2208 may be coupled. In another example, the RF device 2200 may not include a local oscillator 2206, but may include interface circuitry (e.g., connectors and supporting circuitry) to which the local oscillator 2206 may be coupled.

As shown in FIG. 6, the RF device 2200 may include an antenna 2202, a duplexer 2204 (e.g., if the RF device 2200 is an FDD RF device; otherwise the duplexer 2204 may be omitted), a local oscillator 2206, a digital processing unit 2208. As also shown in FIG. 6, the RF device 2200 may include an RX path that may include an RX path amplifier 2212, an RX path pre-mix filter 2214, a RX path mixer 2216, an RX path post-mix filter 2218, and an ADC 2220. As further shown in FIG. 6, the RF device 2200 may include a TX path that may include a TX path amplifier 2222, a TX path post-mix filter 2224, a TX path mixer 2226, a TX path pre-mix filter 2228, and a DAC 2230. Still further, the RF device 2200 may further include an impedance tuner 2232, an RF switch 2234, and control logic 2236. In various embodiments, the RF device 2200 may include multiple instances of any of the components shown in FIG. 6. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 6) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 6 as control logic 2236, e.g., an RF FE control interface. In some embodiments, the control logic 2236 may be used to perform functions such as enhance control of complex RF system environment, support implementation of envelope tracking techniques, or reduce dissipated power within the RF device 2200.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wide-band antenna or a plurality of band-specific antennas (i.e., a plurality of antennas each configured to receive and/or transmit signals in a specific band of frequencies). In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 6, in some embodiments, the RF device 2200 may further include a memory device, configured to cooperate with the digital processing unit 2208.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or very close to the carrier frequency of the radio signal. In other embodiments, the RF device 2200 may make use of downconversion to the IF. IFs may be used in superheterodyne radio receivers, in which a received RF signal is shifted to an IF before the final detection of the information in the received signal is done. In some embodiments, the RX path mixer 2216 may include several stages of IF conversion.

Although a single RX path mixer 2216 is shown in the RX path of FIG. 6, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted. The ADC 2220 may include any embodiment of residue generation arrangements with programmable analog delay as described herein.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a band-pass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

The TX path amplifier 2222 may include an array of power amplifiers.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 6, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 6 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path.

Select Examples

The following paragraphs provide various select examples of the embodiments disclosed herein.

Example 1 provides a residue generation arrangement for use in a CT stage of an ADC. The arrangement includes a delay circuit, having an input, configured to receive an analog input, an output, configured to output a delayed analog input, and a cascade of N analog delay sections (i.e., N delay sections connected in series), the cascade coupled between the input and the output of the delay circuit (i.e., an input of the first delay section is coupled to the input of the delay circuit and is configured to receive the analog input and an output of the Nth delay section is coupled to the output of the delay circuit and is configured to output the delayed analog input, with each delay section in between configured to receive an output of the previous delay section as an input), where N is an integer greater than 1, and where each delay section of the N cascaded delay sections is configured to provide a respective delay to the analog input. Furthermore, the delay circuit also includes a selector, configured to select an input or an output of one of the delay sections to provide as an output of the selector. In addition, the arrangement further includes a quantizer, configured to generate a digital input to a feedforward DAC based on the output of the selector, the feedforward DAC, configured to generate a feedforward path analog output based on the digital input generated by the quantizer, and a summation node, configured to generate a residue signal based on the delayed analog input and the feedforward path analog output.

Example 2 provides the residue generation arrangement according to example 1, where the selector is configured to select the input or the output of one of the delay sections based on a control signal.

Example 3 provides the residue generation arrangement according to examples 1 or 2, where the selector is a multiplexer, configured to receive the input for each of the delay sections and to provide the input of one of the delay sections as the output of the selector, or receive the output from each of the delay sections and to provide the output of one of the delay sections as the output of the selector.

Example 4 provides the residue generation arrangement according to any one of the preceding examples, further including a filter configured to filter the output of the selector to generate a filtered output of the selector, where the quantizer is configured to generate the digital input based on the filtered output of the selector. Such a filter may, e.g., act as an anti-aliasing filter. For example, the filter may be configured to reduce or eliminate blockers, where, as used in the art, the term "blocker" refers to any signal that is present outside the bandwidth where desired signals lie.

Example 5 provides the residue generation arrangement according to any one of the preceding examples, where the delay provided by at least one of the delay sections is programmable.

Example 6 provides the residue generation arrangement according to any one of the preceding examples, where at least one of the delay sections includes a resonant inductor-capacitor (LC) lattice structure configured to generate a delayed differential analog input signal pair, the LC lattice structure including two inductive components and two capacitive components, where either the two inductive components are cross-coupled or the two capacitive components are cross-coupled.

Example 7 provides the residue generation arrangement according to example 6, where each of the delay sections includes the LC lattice structure.

Example 8 provides the residue generation arrangement according to example 7, where at least two of the delay sections have different resonant frequencies to provide a wide-band delay over frequency.

Example 9 provides the residue generation arrangement according to any one of the preceding examples, where at least one of the delay sections includes a resonant resistor-capacitor (RC) lattice structure configured to generate a delayed differential analog input signal pair, the RC lattice structure including two resistive components and two capacitive components, where either the two resistive components are cross-coupled or the two capacitive components are cross-coupled.

Example 10 provides the residue generation arrangement according to example 9, where each of the delay sections includes the RC lattice structure.

Example 11 provides the residue generation arrangement according to example 10, where at least two of the delay sections have different resonant frequencies to provide a wide-band delay over frequency.

Example 12 provides an ADC that includes a first stage, configured to generate a residue signal, and further includes a second stage, configured to process a signal based on the residue signal. The first stage includes a residue generation arrangement, comprising analog delay sections 1 through N, coupled in series, each delay section configured to apply a respective delay to a signal received by the delay section, where N is an integer greater than 1, the delay section 1 is configured to receive an analog input, the delay section N is configured to output a delayed analog input, and each delay section i, where i is an integer greater than 1 and equal to or less than N, is configured to receive a signal based on an output of the delay section i−1. The residue generation arrangement further includes a selector, configured to select an input or an output of one of the delay sections 1 through N to provide as an output of the selector, a quantizer, configured to generate a digital input to a feedforward DAC based on the output of the selector, the feedforward DAC, configured to generate a feedforward path analog output based on the digital input generated by the quantizer, and a summation node, configured to generate a residue signal based on the delayed analog input and the feedforward path analog output.

Example 13 provides the ADC according to example 12, where the first stage further includes an amplifier, configured to amplify or filter the residue signal.

Example 14 provides the ADC according to examples 12 or 13, further including an additional ADC (e.g., a backend ADC), configured to convert a signal based on the residue signal (e.g., one of the residue signal generated by the summation node, the amplified residue signal, or the residue signal processed in some other manner) from an analog signal to a digital signal. In some embodiments, multiple residue generation stages may be used and the signal converted by the additional ADC may be a signal based on the residue signal generated by the last stage, for example.

Example 15 provides the ADC according to example 14, further including a digital reconstruction block, configured to generate an ADC output based on an output of the additional ADC and the digital input generated by the quantizer.

Example 16 provides the ADC according to any one of examples 12-15, where the selector is configured to operate in one of a first mode and a second mode, when operating in the first mode, the selector is configured to select the input or the output of one of the delay sections 1 through N to provide as the output of the selector, and when operating in the second mode, the selector is configured to select the input or the output of another one of the delay sections 1 through N to provide as the output of the selector.

Example 17 provides the ADC according to any one of examples 12-16, where the first stage is a continuous-time stage.

Example 18 provides the ADC according to any one of examples 12-17, where the second stage is a discrete-time stage.

In various further examples, the residue generation arrangement of the first stage of the ADC according to any one of examples 12-18 may include the residue generation arrangement according to any one of the preceding examples.

Example 19 provides a method for generating a residue signal in a continuous-time stage of an ADC. The method includes propagating an analog input signal through a plurality of cascaded analog delay sections, where a first delay section of the plurality of cascaded analog delay sections is configured to receive an analog input as an input and apply a first delay to the analog input to generate an output, and where each subsequent delay section of the plurality of cascaded analog delay sections is configured to receive the output of a preceding delay section as a input and to apply a respective delay to the output of the preceding delay section to generate an output; configuring a selector to select the input or the output of one of the plurality of cascaded analog delay sections to provide as an output of the selector; generating a digital input based on the output of the selector; generating a feedforward path analog output based on the digital input; and generating the residue signal based on the feedforward path analog output and the output of a last delay section of the plurality of cascaded analog delay sections.

Example 20 provides the method according to example 19, where at least one of the plurality of cascaded analog delay sections includes a resonant inductor-capacitor (LC) lattice structure configured to generate a delayed differential analog input signal pair, the LC lattice structure including two inductive components and two capacitive components, where either the two inductive components are cross-coupled or the two capacitive components are cross-coupled.

In various further examples, the method according to examples 19 or 20 may include features of, or be implemented in, the residue generation arrangement according to any one of examples 1-11 or/and the ADC according to any one of examples 12-18.

Other Implementation Notes, Variations, and Applications

The described techniques for generating residue signals to be provided to subsequent stages of an ADC may be particularly suitable for high-speed, CT, high precision applications where residue-generating ADCs are used. While embodiments of the present disclosure were described above with references to exemplary implementations as shown in FIGS. 1-6, a person skilled in the art will realize that the various teachings described above are applicable to a large variety of other implementations. For example, some applications which can greatly benefit from implementing residue generation arrangements with programmable analog delay include instrumentation, testing, spectral analyzers, military purposes, radar, wired or wireless communications, mobile telephones (especially because standards continue to push for higher speed communications), and base stations.

In the discussions of the embodiments above, components of a system, such as inductors, capacitors, filters, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to providing residue generation arrangements with programmable analog delay as described herein.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors (DSPs), microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on a chip (SOC) package, either in part, or in whole. An SOC represents an integrated circuit (IC) that integrates components of a computer or other electronic system into a single chip. It may contain digital, analog, mixed-signal, and often radio frequency (RF) functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-4, and 6) have only been offered for purposes of example and teaching only. Such information may be varied considerably without departing from the spirit of the present disclosure. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular component arrangements. Various modifications and changes may be made to such embodiments without departing from the scope of the present disclosure. The description and drawings are, accordingly, to be regarded in an illustrative rather than in a restrictive sense.

The invention claimed is:

1. A residue generation arrangement for use in a continuous-time stage of an analog to digital converter (ADC), the arrangement comprising:
   a delay circuit, comprising:
      an input, configured to receive an analog input,
      an output, configured to output a delayed analog input,
      a cascade of N delay sections, the cascade coupled between the input and the output of the delay circuit, where N is an integer greater than 1, and where each delay section is configured to provide a respective delay to the analog input, and
      a selector, configured to select an input or an output of one of the delay sections to provide as an output of the selector;
   a quantizer, configured to generate a digital input to a feedforward digital to analog converter (DAC) based on the output of the selector;
   the feedforward DAC, configured to generate a feedforward path analog output based on the digital input generated by the quantizer; and
   a summation node, configured to generate a residue signal based on the delayed analog input and the feedforward path analog output.

2. The residue generation arrangement according to claim 1, wherein the selector is configured to select the input or the output of one of the delay sections based on a control signal.

3. The residue generation arrangement according to claim 1, wherein the selector is a multiplexer, configured to:
   receive the input for each of the delay sections and to provide the input of one of the delay sections as the output of the selector, or
   receive the output from each of the delay sections and to provide the output of one of the delay sections as the output of the selector.

4. The residue generation arrangement according to claim 1, further comprising a filter configured to filter the output of the selector to generate a filtered output of the selector, wherein the quantizer is configured to generate the digital input based on the filtered output of the selector.

5. The residue generation arrangement according to claim 1, wherein the delay provided by at least one of the delay sections is programmable.

6. The residue generation arrangement according to claim 1, wherein at least one of the delay sections includes a resonant inductor-capacitor (LC) lattice structure configured to generate a delayed differential analog input signal pair, the LC lattice structure comprising two inductive components and two capacitive components, where either the two inductive components are cross-coupled or the two capacitive components are cross-coupled.

7. The residue generation arrangement according to claim 6, wherein each of the delay sections includes the LC lattice structure.

8. The residue generation arrangement according to claim 7, wherein at least two of the delay sections have different resonant frequencies.

9. The residue generation arrangement according to claim 1, wherein at least one of the delay sections includes a resonant resistor-capacitor (RC) lattice structure configured to generate a delayed differential analog input signal pair, the RC lattice structure comprising two resistive components and two capacitive components, where either the two resistive components are cross-coupled or the two capacitive components are cross-coupled.

10. The residue generation arrangement according to claim 9, wherein each of the delay sections includes the RC lattice structure.

11. The residue generation arrangement according to claim 10, wherein at least two of the delay sections have different resonant frequencies.

12. An analog-to-digital converter (ADC), comprising:
a first stage, comprising a residue generation arrangement that includes:
analog delay sections 1 through N coupled in series, each delay section configured to apply a respective delay to a signal received by the delay section, wherein:
N is an integer greater than 1,
the delay section 1 is configured to receive an analog input,
the delay section N is configured to output a delayed analog input, and
each delay section i, where i is an integer greater than 1 and equal to or less than N, is configured to receive a signal based on an output of the delay section i−1,
a selector, configured to select an input or an output of one of the delay sections 1 through N to provide as an output of the selector,
a quantizer, configured to generate a digital input to a feedforward digital to analog converter (DAC) based on the output of the selector,
the feedforward DAC, configured to generate a feedforward path analog output based on the digital input generated by the quantizer, and
a summation node, configured to generate a residue signal based on the delayed analog input and the feedforward path analog output; and
a second stage, configured to process a signal based on the residue signal.

13. The ADC according to claim 12, wherein the first stage further includes an amplifier, configured to amplify or filter the residue signal.

14. The ADC according to claim 12, further comprising an additional ADC, configured to convert a signal based on the residue signal from an analog signal to a digital signal.

15. The ADC according to claim 14, further comprising a digital reconstruction block, configured to generate an ADC output based on an output of the additional ADC and the digital input generated by the quantizer.

16. The ADC according to claim 12, wherein:
the selector is configured to operate in one of a first mode and a second mode,
when operating in the first mode, the selector is configured to select the input or the output of one of the delay sections 1 through N to provide as the output of the selector, and
when operating in the second mode, the selector is configured to select the input or the output of another one of the delay sections 1 through N to provide as the output of the selector.

17. The ADC according to claim 12, wherein the first stage is a continuous-time stage.

18. The ADC according to claim 12, wherein the second stage is a discrete-time stage.

19. A method for generating a residue signal in a continuous-time stage of an analog to digital converter (ADC), the method comprising:
propagating an analog input signal through a plurality of cascaded analog delay sections, where a first delay section of the plurality of cascaded analog delay sections is configured to receive an analog input as an input and apply a first delay to the analog input to generate an output, and where each subsequent delay section of the plurality of cascaded analog delay sections is configured to receive the output of a preceding delay section as a input and to apply a respective delay to the output of the preceding delay section to generate an output;
configuring a selector to select the input or the output of one of the plurality of cascaded analog delay sections to provide as an output of the selector;
generating a digital input based on the output of the selector;
generating a feedforward path analog output based on the digital input; and
generating the residue signal based on the feedforward path analog output and the output of a last delay section of the plurality of cascaded analog delay sections.

20. The method according to claim 19, wherein at least one of the plurality of cascaded analog delay sections includes a resonant inductor-capacitor (LC) lattice structure configured to generate a delayed differential analog input signal pair, the LC lattice structure comprising two inductive components and two capacitive components, where either the two inductive components are cross-coupled or the two capacitive components are cross-coupled.

* * * * *